US011646210B2

(12) United States Patent
Wu

(10) Patent No.: US 11,646,210 B2
(45) Date of Patent: May 9, 2023

(54) REDUCED INTERFERENCE, REAL-TIME SENSING OF PROPERTIES IN MANUFACTURING EQUIPMENT

(71) Applicant: Tokyo Electron Limited, Tokyo (JP)

(72) Inventor: Tong Wu, Kurokawa-gun (JP)

(73) Assignee: Tokyo Electron Limited, Tokyo (JP)

( * ) Notice: Subject to any disclaimer, the term of this patent is extended or adjusted under 35 U.S.C. 154(b) by 1010 days.

(21) Appl. No.: 16/429,800

(22) Filed: Jun. 3, 2019

(65) Prior Publication Data

US 2019/0385875 A1 Dec. 19, 2019

Related U.S. Application Data

(60) Provisional application No. 62/686,104, filed on Jun. 18, 2018.

(51) Int. Cl.
*H01L 21/67* (2006.01)
*H01J 37/32* (2006.01)

(52) U.S. Cl.
CPC .... *H01L 21/67253* (2013.01); *H01J 37/3211* (2013.01); *H01L 21/67248* (2013.01); *H01J 2237/332* (2013.01); *H01J 2237/3341* (2013.01)

(58) Field of Classification Search
CPC .......... H01L 21/67248; H01L 21/67253; H01J 37/3211; H01J 2237/332; H01J 2237/3341
See application file for complete search history.

(56) References Cited

U.S. PATENT DOCUMENTS

| 4,484,098 A | 11/1984 | Cullen et al. |
| 6,794,310 B1 * | 9/2004 | Miller .................... G01K 1/024 374/E1.004 |

(Continued)

FOREIGN PATENT DOCUMENTS

| JP | 2006512481 | 4/2006 |
| JP | 2007-171047 A | 7/2007 |

(Continued)

OTHER PUBLICATIONS

Korean Intellectual Property Office, International Search Report and Written Opinion for International application No. PCT/US2018/046872, dated Dec. 17, 2018, 9pp.

(Continued)

*Primary Examiner* — Yuechuan Yu
(74) *Attorney, Agent, or Firm* — Oblon, McClelland, Maier & Neustadt, L.L.P.

(57) ABSTRACT

An apparatus and method for real-time sensing of properties in industrial manufacturing equipment are described. The sensing system includes first plural sensors mounted within a processing environment of a semiconductor device manufacturing system, wherein each sensor is assigned to a different region to monitor a physical or chemical property of the assigned region of the manufacturing system, and a reader system having componentry configured to simultaneously and wirelessly interrogate the plural sensors. The reader system uses a single high frequency interrogation sequence that includes (1) transmitting a first request pulse signal to the first plural sensors, the first request pulse signal being associated with a first frequency band, and (2) receiving uniquely identifiable response signals from the first plural sensors that provide real-time monitoring of variations in the physical or chemical property at each assigned region of the system.

21 Claims, 9 Drawing Sheets

(56) References Cited

U.S. PATENT DOCUMENTS

| | | |
|---|---|---|
| 6,888,491 B2 | 5/2005 | Richter |
| 6,898,558 B2 | 5/2005 | Klekotka |
| 7,648,269 B2 | 1/2010 | Toyoshima |
| 8,378,269 B2 | 2/2013 | Matsumoto et al. |
| 8,602,706 B2 | 12/2013 | Hofmeister et al. |
| 8,881,373 B1 | 11/2014 | Koepp et al. |
| 9,004,366 B2 | 4/2015 | Smith et al. |
| 9,076,956 B2 | 7/2015 | Lee et al. |
| 9,196,516 B2 | 11/2015 | McCloud et al. |
| 9,222,842 B2 | 12/2015 | Sun et al. |
| 2004/0066323 A1 | 4/2004 | Richter |
| 2005/0011611 A1* | 1/2005 | Mahoney .......... H01J 37/32935 156/345.24 |
| 2005/0151544 A1 | 7/2005 | Mahoney et al. |
| 2007/0170170 A1* | 7/2007 | Sata .................... H05B 1/0233 219/497 |
| 2008/0198895 A1 | 8/2008 | Davis et al. |
| 2011/0038692 A1 | 2/2011 | Hofmeister et al. |
| 2011/0199160 A1 | 8/2011 | Yamanaka |
| 2011/0241839 A1 | 10/2011 | Lal et al. |
| 2012/0091855 A1* | 4/2012 | Hatcher, Jr. .......... C23C 16/403 427/255.6 |
| 2013/0018599 A1 | 1/2013 | Peng |
| 2013/0077666 A1 | 3/2013 | Shibata |
| 2014/0001918 A1 | 1/2014 | Lee et al. |
| 2015/0260587 A1 | 9/2015 | Zheng et al. |
| 2016/0376695 A1* | 12/2016 | Yang ...................... G01N 29/11 204/298.03 |
| 2017/0176349 A1 | 6/2017 | Gopalan et al. |
| 2019/0057887 A1 | 2/2019 | Ballandras et al. |

FOREIGN PATENT DOCUMENTS

| | | |
|---|---|---|
| JP | 2007171047 | 7/2007 |
| JP | 2009-229428 A | 10/2009 |
| JP | 5098045 | 12/2012 |
| JP | 5346256 | 11/2013 |
| JP | 5413767 | 2/2014 |
| JP | 5461256 | 4/2014 |
| KR | 100881786 | 2/2009 |
| TW | I227520 B | 2/2005 |
| WO | 03103021 | 12/2003 |
| WO | 2005052526 | 6/2005 |
| WO | WO 2010/077727 A1 | 7/2010 |

OTHER PUBLICATIONS

Jun-Ichi Kushibiki, Izumi Takanaga, Mototaka Arakawa, Toshio Sannomiya, "Accurate Measurements of the Acoustical Physical Constants of LiNbO3 and LiTaO3 Single Crystals", IEEE Transactions on Ultrasonics, Ferroelectrics, and Frequency Control, Sep. 1999, 1315-1323, vol. 46, No. 5.

Victor P. Plessky and Leonhard M. Reindl, "Review on Saw RFID Tags", IEEE Transactions on Ultrasonics, Ferroelectrics, and Frequency Control, Mar. 2010, 654-668, vol. 57, No. 3.

An American National Standards Institute, "IEEE Standard on Piezoelectricity", Standards Committee of the IEEE Ultrasonics, Ferroelectrics, and Frequency Control Society, 1987, 1-64.

Saku Lehtonen, Victor P. Plessky, Clinton S. Hartmann, Martti M. Salomaa, "SPUDT Filters for the 2.45 GHz ISM Band", IEEE Transactions on Ultrasonics, Ferroelectrics, and Frequency Control, Dec. 2004, 1697-1703, vol. 51, No. 12.

Prof. Dr. Leonhard Reindl, "Wireless Passive SAW Identification Marks and Sensors", 2nd Int. Symp. Acoustic Wave Devices for Future Mobile Communication Systems, Chiba Univ. Mar. 3-5, 2004, 1-15.

Leonhard Reindl, Gerd Scholl, Thomas Ostertag, Holger Scherr, Ulrich Wolff, Frank Schmidt, Theory and Application of Passive SAW Radio Transponders as Sensors, IEEE Transactions on Ultrasonics, Ferroelectrics, and Frequency Control, Sep. 1998, 1281-1292, vol. 45, No. 5.

International Search Report and Written Opinion of the International Searching Authority dated Sep. 20, 2019 in PCT/US2019/035193 filed Jun. 3, 2019, 11 pages.

International Search Report and Written Opinion of the International Searching Authority dated Dec. 17, 2018 in PCT/US2018/046872 filed Aug. 17, 2018, 9 pages.

Combined Taiwanese Office Action and Search Report dated Aug. 2, 2022 in Taiwanese Patent Application No. 108120021 (with English translation), 15 pages.

Office Action dated Jan. 29, 2021 in co-pending U.S. Appl. No. 16/104,335, 7 pages.

International Preliminary Report on Patentability and Written Opinion dated Dec. 30, 2020 in PCT/US2019/035193 (submitting English translation only), 8 pages.

* cited by examiner

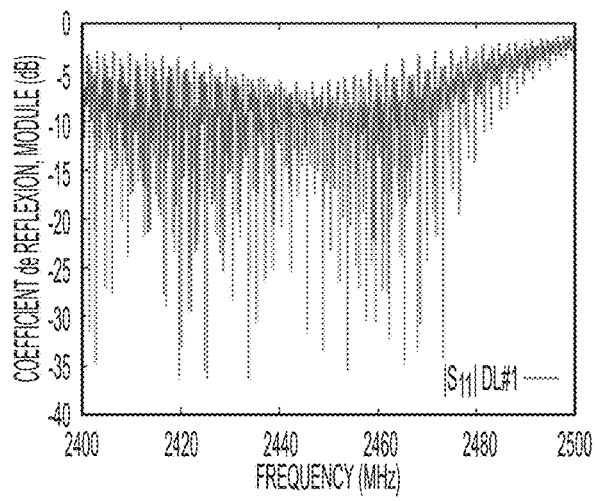
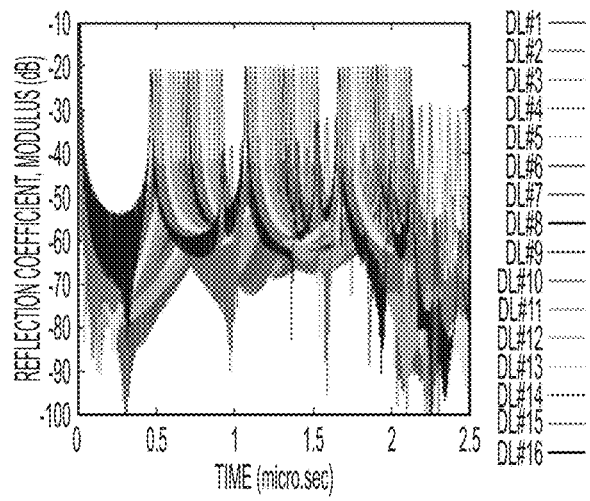
FIG. 6A
FIG. 6B
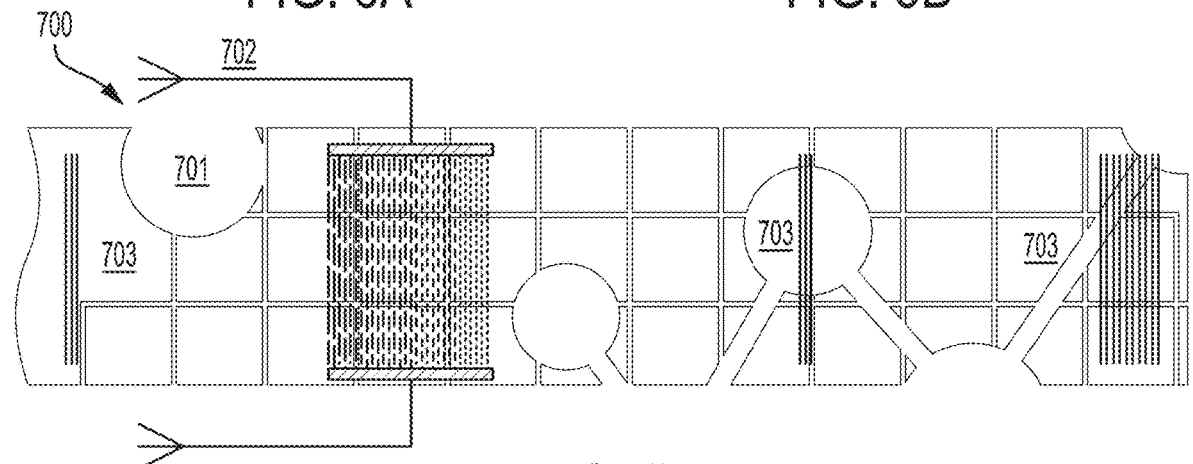
FIG. 7
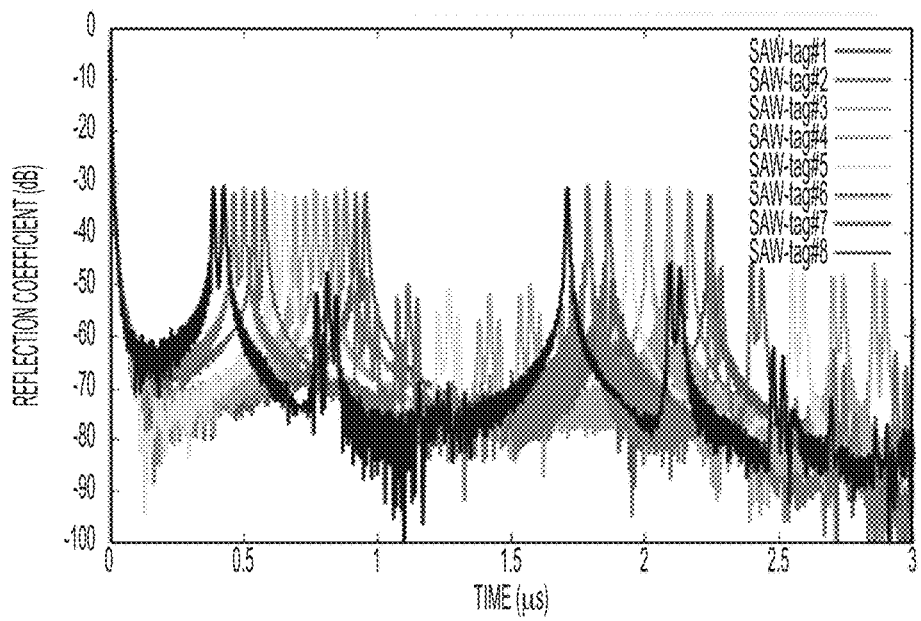
FIG. 8

REDUCED INTERFERENCE, REAL-TIME SENSING OF PROPERTIES IN MANUFACTURING EQUIPMENT

CROSS REFERENCE TO RELATED APPLICATIONS

The present application claims the benefit of U.S. Provisional Patent Application No. 62/686,104, filed on Jun. 18, 2018, entitled "REDUCED INTERFERENCE, REAL-TIME SENSING OF PROPERTIES IN MANUFACTURING EQUIPMENT", which is incorporated herein by reference in its entirety.

FIELD OF INVENTION

The present invention relates to an apparatus and method for monitoring a process in a processing system and, more particularly, to monitoring a process using a monitoring device having an integral sensing and transceiving device. More specifically, the invention relates to real-time sensing of properties in industrial manufacturing, such as semiconductor device manufacturing.

BACKGROUND OF THE INVENTION

The fabrication of integrated circuits (IC) in the semiconductor industry typically employs plasma to create and assist surface chemistry within a plasma reactor necessary to remove material from and deposit material to a substrate. In general, plasma is formed within the plasma reactor under vacuum conditions by heating electrons to energies sufficient to sustain ionizing collisions with a supplied process gas. Moreover, the heated electrons can have energy sufficient to sustain dissociative collisions and, therefore, a specific set of gases under predetermined conditions (e.g., chamber pressure, gas flow rate, etc.) are chosen to produce a population of charged species and chemically reactive species suitable to the particular process being performed within the chamber (e.g., etching processes where materials are removed from the substrate or deposition processes where materials are added to the substrate).

During; for example, an etch process, monitoring the plasma processing system can be very important when determining the state of a plasma processing system and determining the quality of devices being produced. Additional process data can be used to prevent erroneous conclusions regarding the state of the system and the state of the products being produced. For example, the continuous use of a plasma processing system can lead to a gradual degradation of the plasma processing performance and ultimately to complete failure of the system, Additional process related data and tool related data will improve the management of a material processing system and the quality of the products being produced.

SUMMARY

Techniques described herein pertain to an apparatus and method for monitoring a process in a processing system and; more particularly, to monitoring a process using a monitoring device having an integral sensing and transceiving device. More specifically, the invention relates to real-time sensing of properties in industrial manufacturing, such as semiconductor device manufacturing.

According to various embodiments, an apparatus for real-time sensing of properties during a manufacturing process are described. The sensing system includes a sensor configured to be mounted within a processing chamber, the processing chamber having a structure that at least partially surrounds and encloses a processing environment, wherein the sensor is assigned to a specific region of the processing chamber to monitor a physical or chemical property of the assigned region of the chamber, and a reader system having componentry configured to wirelessly interrogate the sensor using a high frequency interrogation sequence that includes (1) transmitting a request pulse signal to the sensor, the request pulse signal being associated with a designated frequency band, and (2) receiving a uniquely identifiable sensor response signal from the sensor that provides real-time monitoring of variations in the physical or chemical property at the assigned region of the chamber. The structure of the processing chamber produces an interference response signal that is received by the reader system immediately following the transmission of the request pulse signal, and the sensor is designed to delay the sensor response signal for a delay time that exceeds the time duration of the interference response signal from the structure.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

In the accompanying drawings:

FIGS. 6A and 6B exemplify response signals following interrogation of plural sensors according to an embodiment;

FIG. 7 depicts a representative view of a SAW-tag sensor according to yet another embodiment;

FIG. 8 exemplifies response signals following interrogation of plural sensors according to an embodiment;

DETAILED DESCRIPTION

Techniques described herein pertain to an apparatus and method for monitoring a process in an industrial manufacturing system and; more particularly, to monitoring a process using a monitoring device having an integral sensing and transceiving device. The manufacturing system can include a semiconductor manufacturing system. The manufacturing system can facilitate manufacturing of semiconductor devices, photonic devices, photo-emission devices, photo-absorption devices, or photo-detection devices. The manufacturing system can include a non-semiconductor manufacturing system. The manufacturing system can facilitate manufacturing of metallic, semi-metallic, or non-metallic workpieces. The manufacturing system can facilitate manufacturing of metallic, polymeric, or ceramic workpieces. The manufacturing system can facilitate manufacturing of glass or glass-like workpieces.

According to various embodiments, an apparatus and method for real-time sensing of properties in industrial manufacturing equipment, such as semiconductor device manufacturing equipment, are described. The sensing system includes plural sensors mounted within a processing environment of a semiconductor device manufacturing system, wherein each sensor is assigned to a different region to monitor a physical or chemical property of the assigned region of the manufacturing system, and a reader system having componentry configured to simultaneously and wirelessly interrogate the plural sensors. The reader system uses a single high frequency interrogation sequence that includes (1) transmitting a first request pulse signal to the first plural sensors, the first request pulse signal being associated with a first frequency band, and (2) receiving uniquely identifiable response signals from the first plural sensors that provide real-time monitoring of variations in the physical or chemical property at each assigned region of the system. In particular, a wafer-type sensor of a circuit capable of eliminating the need for a wired power supply, to comply with automation requirements, capable to withstand heat transfer due to ionic impact and measuring the temperature distribution on a wafer, among other things, is described in various embodiments.

Figure 1A:
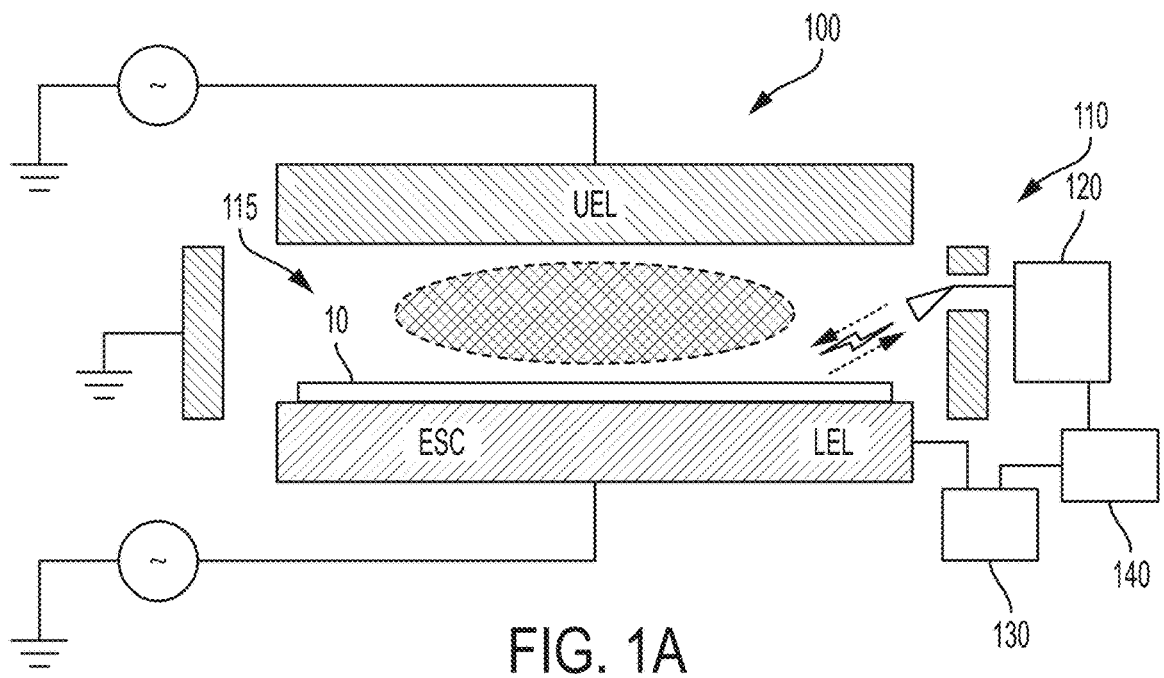
FIGS. 1A through 1C illustrate a schematic representation of an apparatus for real-time sensing of properties in industrial manufacturing equipment according to an embodiment.
Figure 1B:
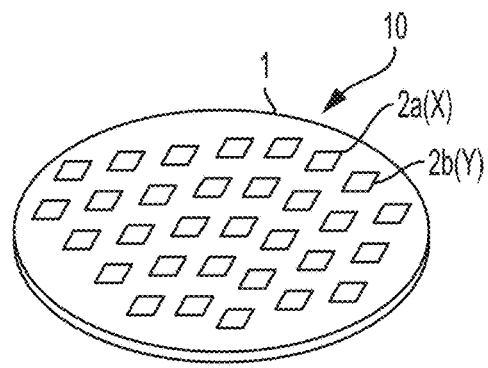
Figure 1C:
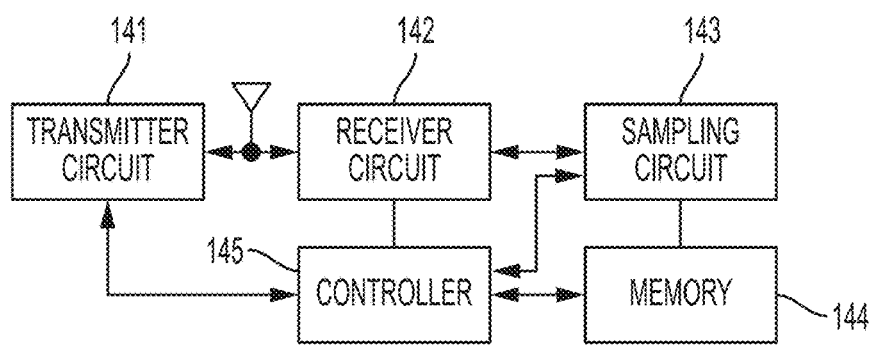

According to an embodiment, an apparatus 100 for real-time sensing of properties in semiconductor device manufacturing equipment is described and depicted in FIGS. 1A through 1C. The apparatus 110 includes: first plural sensors 2A, 2B (see FIG. 1B) mounted within a processing environment 115 of a semiconductor device manufacturing system 100, wherein each sensor 2A, 2B is assigned to a different region to monitor a physical or chemical property of the assigned region on a workpiece 1 (or substrate); and a reader system 120 having componentry configured to simultaneously and wirelessly interrogate the first plural sensors using a single high frequency interrogation sequence. The interrogation sequence can include (1) transmitting a first request pulse signal to the first plural sensors, the first request pulse signal being associated with a first frequency band, and (2) receiving uniquely identifiable response signals from the first plural sensors that provide real-time monitoring of variations in the physical or chemical property at each assigned region of the system, wherein the first plural sensors are made operable in the first frequency band according to design rules that permit the simultaneous interrogation without collision between the response signals echoed from each sensor operating in the first frequency band. Sensor system 10 can include the plural sensors 2A, 2B mounted on workpiece 1. Workpiece 1 can be arranged within the processing environment 115 of the semiconductor device manufacturing system 100, wherein the first plural sensors 2A, 2B are mounted on the workpiece 1 (see FIG. 1B). The number of sensors in the first plural sensors can exceed 15 sensors, preferably more than 30 sensors, preferably more than 45 sensors, and more preferably more than 60 sensors.

Semiconductor device manufacturing system 100 can include a holder 130, which may or may not include a clamping mechanism, such as a mechanical clamping system or an electrical clamping system (e.g., ESC, electrostatic chuck). In response to signals from a control system 140, a holder control system 130 can adjust properties affecting the processing of workpiece 1, or production workpiece (not shown). Embodiments can include temperature control elements spatially oriented to affect process conditions in different regions of workpiece 1, or a production workpiece. Alternatively, gas flows, and other processing properties, e.g., pressure, plasma power, bias power, etc., can be adjusted in response to signals from control system 140.

In some embodiments, processing environment 115 includes a gas-phase environment without plasma. In other embodiments, processing environment 115 includes a gas-phase environment with plasma.

The first frequency band can include an excitation frequency in the 2.45 GHz-centered ISM band, as an example, however, other frequency bands are contemplated. The frequency band can be selected to permit electromagnetic wave propagation between the reader system and the instrumented substrate.

The semiconductor device manufacturing system can include an etching system, a deposition system, a plating system, a cleaning system, an ashing system, a thermal treatment system, a lithographic coating system, or a polishing system, or other semiconductor processing system. FIGS. 17A through 17D depict several gas-phase and/or plasma processing systems, within which the sensor system can be implemented.

As further described below, depending on the environment within which the instrumented substrate will be exposed, several techniques are proposed to protect the sensor(s). Protective layers, deposited or formed over the sensor, are examples of the protection provided to a sensor in an erosive and/or corrosive environment.

According to various embodiments, multiple sensor groupings are assigned to plural, uniquely defined frequency bands, wherein the multiple sensor groupings including the first plural sensors assigned to the first frequency band (to be described in greater detail below). The number of sensors assigned to a sensor grouping and associated frequency band may not exceed 25 sensors; however, more or less are contemplated. Each sensor can include a surface acoustic wave (SAW) delay line device or SAW resonator. The SAW devices can be mounted on workpiece 1 exhibiting an electromechanical coupling coefficient greater than or equal to 1%, or 2 to 3%. And, the substrate can include $LiNbO_3$, $LiTaO_3$, or $La_3Ga_5SiO_{14}$. Other materials for conducting surface acoustic waves are contemplated. Lithium niobate or lithium tantalite may be used for lower temperature operations, and langasite ($La_3Ga_5SiO_{14}$) may be used for higher temperature operations. The physical or chemical property can include temperature or differential temperature. The physical or chemical property can include temperature or differential temperature, wherein an echo drift due to temperature ranges up to, and inclusive of, 100 ns, or 0 ns. The maximum variation in temperature can range up to 200 K. While temperature sensing is described, other properties, physical and chemical are contemplated.

As described in greater detail below, each sensor includes an inter-digitated transducer to excite and subsequently detect surface waves, and one or more reflector groups to diffract and reflect surface waves back towards the inter-digitated transducer, and wherein the one or more reflector groups are spaced apart a pre-determined distance along a wave propagation path from the inter-digitated transducer. The inter-digitated transducer includes two interlaced comb-like metal structures formed on the surface of a piezoelectric substrate, and the one or more reflectors include one or more groupings of one or more spaced apart metal line formed on the piezoelectric substrate. Further, the inter-digitated transducer can be coupled to at least one antenna for receiving and transmitting signals between each sensor and the reader system. The at least one antenna can be designed to an impedance of 50 Ohms. The electrical impedance of the inter-digitated transducer can be substantially matched to the electrical impedance of the at least one antenna at a frequency within the designated frequency band. And, the spectral range of the designated frequency band, such as the first frequency band, can be less than 100 MHz, or 50 MHz. The at least one antenna can include a meander antenna, a monopole or dipole antenna, or other antenna, as listed below.

The inter-digitated transducer can include 10 to 20 pairs of inter-digitated electrode pairs, or 15 inter-digitated pairs, for example. The inter-digitated transducer can include two or more groups of inter-digitated electrode pairs, and wherein each group of inter-digitated electrode pairs is designed with a different electrode pitch. The single high frequency interrogation sequence can include interrogating sensors with a time-resolved excitation signal and processing received echo signals in the time domain, or with a frequency modulated excitation signal and processing received echo signals in the frequency domain.

When the physical or chemical property includes temperature, each sensor can exhibit a temperature coefficient of delay (TCD) equal to or greater than 30 ppm-$K^{-1}$, or 50 ppm-$K^{-1}$, or 75 ppm-$K^{-1}$, or 100 ppm-$K^{-1}$.

As mentioned, the one or more reflectors of each sensor can be arranged to produce an impulse response signal in the time domain exhibiting a train of two or more distinct echo impulse responses. The one or more reflectors of each sensor can be arranged to produce a first echo impulse response for each sensor that is received by the reader system in a first time delay range, and a second echo impulse response for each sensor that is received by the reader system in a second time delay range, the second time delay consecutive to the first time delay following a first guard time delay inserted there between. And, the first guard time delay can range up to 200 ns, or range from 100 ns to 200 ns.

The one or more reflectors of each sensor can be arranged to produce an impulse response signal in the time domain exhibiting a train of three or more distinct echo impulse responses. And, the one or more reflectors of each sensor can be arranged to produce a third echo impulse response for each sensor that is received by the reader system in a third time delay range, the third time delay consecutive to the second time delay following a second guard time delay inserted there between. The second guard time delay can range up to 200 ns, or range from 100 ns to 200 ns. The first, second, and third time delay can range up to 5 microseconds.

The reader system 120 can include a radio frequency (RF) filter to reject signals at frequencies outside the designated frequency band. The radio frequency (RF) filter can be designed to reject signals at frequencies outside the designated frequency band. For example, the RF filter can reject signals originating from harmonic frequencies of the plasma excitation frequency by excess of 30 dB, or even 40 dB.

While first plural sensors are described, second plural sensors can be mounted on or within the semiconductor device manufacturing system 100, wherein each sensor is assigned to a different region to monitor a physical or chemical property of the assigned region of the system, and wherein the second plural sensors are made operable in the second frequency band according to design rules that permit the simultaneous interrogation without collision between the response signals echoed from each sensor.

FIG. 1C schematically illustrates a reader system, including a transmitter circuit 141, a receiver circuit 142, a sampling circuit 143, memory 144, and a controller 145 to control sensor interrogation, manage signal processing to and from each component, and assess the processing state of the semiconductor device manufacturing system 100.

Figure 2:
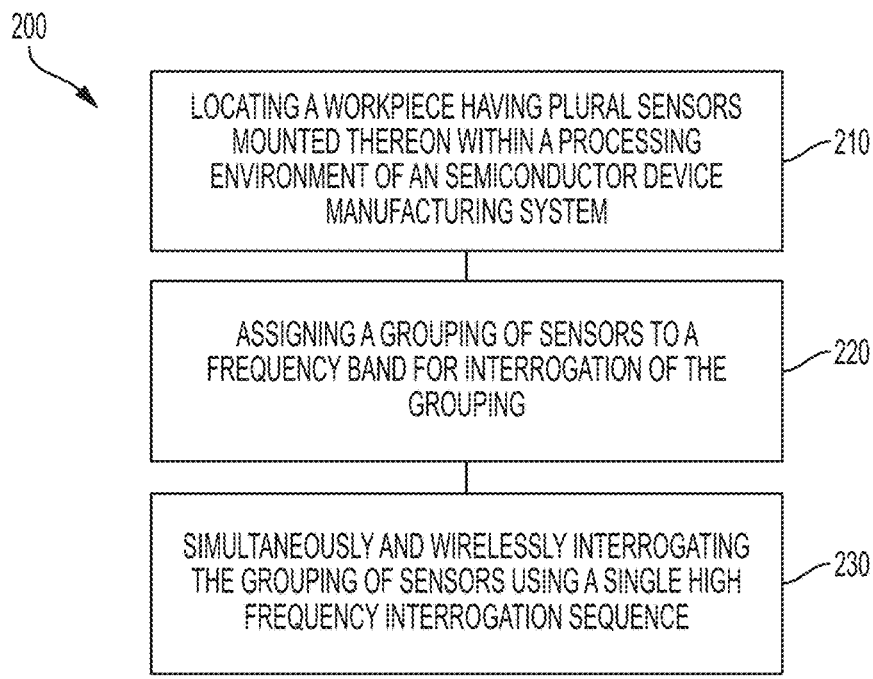
FIG. 2 provides a flow chart illustrating a method for real-time sensing of properties in semiconductor device manufacturing equipment according to an embodiment.

According to yet another embodiment, a method for real-time sensing of properties in semiconductor device manufacturing equipment is described. The method is depicted in FIG. 2, and includes: locating a workpiece having plural sensors mounted thereon within a processing environment of an semiconductor device manufacturing system in 210; assigning a grouping of sensors to a frequency band for interrogation of the grouping in 220; and simultaneously and wirelessly interrogating each grouping of sensors using a single high frequency interrogation sequence in 230 that includes (1) transmitting a request pulse signal to the plural sensors designated with a sensor grouping, the request pulse signal being associated with a designated frequency band, and (2) receiving uniquely identifiable response signals from the plural sensors that provide real-time monitoring of variations in the physical or chemical property at each assigned region of workpiece 1.

As an example, a sensing system is described below for monitoring temperature or differential temperature. The wafer-type sensor can include a workpiece, onto which a plurality of temperature measurement sensors are connected. The temperature measurement sensors can include surface acoustic wave (SAW) delay line sensors or SAW resonator sensors, each of which are connected to a proper antenna. The sensors are located according to the desired temperature mapping required for the workpiece or process. The SAW sensors can be based on delay lines designed in such a way that they can be interrogated simultaneously with one or more, including a single, high frequency interrogation sequence that may include either (i) a time-resolved excitation and signal processing, or (ii) a frequency-modulated continuous-wave (FMCW) approach. In the latter, the frequency-modulated continuous wave approach can include Fourier signal processing to convolve and de-convolve information in frequency or wave-number space.

The SAW delay lines can be designed to match, or substantially match, the antenna impedance across a range of temperature and sensor performance. A burst signal can be used when the interrogation and the signal processing are time-resolved with a duration equal to, or approximately equal to, the inverse of the width of the frequency band of the transducer (i.e., a number of oscillations equal to the number of the finger pairs of the transducer). The SAW sensor can be designed in such a way that several sensors can be interrogated simultaneously without collision, shifting the sensor response in time in a way that avoids any pulse superposition on the whole operating ranges and conditions.

Design rules are given to explain how this design is achieved using Rayleigh-like SAW on lithium niobate (LiNbO$_3$), as an example, without generality restriction. The use of a silica passivation layer can allow for controlling the actual temperature sensitivity, the electromechanical coupling, and the reflection coefficient of the sensor. The number of sensors that can be interrogated without collision can be increased significantly by using frequency bands shifted in such a way that the interrogation of one set of sensors in a given band will poorly couple energy in another band and preventing any cross-coupling by using a filter on the reader reception stage filtering the currently used band, i.e., only allowing the signal in the band to be received and processed. This filtering operation also allows for improving the signal processing during the application of the plasma, which generates RF (radio frequency) harmonics at a level that can pollute or perturb the sensor response signal processing, notably when the plasma excitation overcomes some tens of Watts, as observed by the inventors.

In another embodiment, the apparatus includes protection for the SAW sensor surface from plasma and/or corrosive chemistry, including ionic impact during plasma excitation, which can irreversibly damage the sensors, the electrodes, and surface quality, thus reducing the sensor life time.

In another embodiment, the apparatus includes an in-situ piezoelectric film deposited onto a silicon (Si) wafer surface, wherein the antenna is bonded onto the sensor location, allowing for both RF signal reception and emission, and sensor surface protection. As described above, the wafer-type sensor can be composed of SAW devices with associated antenna having one or more of the following features: (i) the use of SAW-tag delay lines built on LiNbO$_3$ with similar time response shifted in such a way that several sensors can be interrogated without collision/signal superposition; (ii) the use of several frequency bands to increase the number of sensors that can be interrogated onto a given wafer, using adapted filters to improve the robustness of the signal processing, thus avoiding cross-coupling between the different frequency bands and the mitigation of RF pollution due to the plasma excitation; (iii) the use of an adapted structure to allow for the wafer to be used even during plasma activation (several structures are considered that provide protection of the sensor); and (iv) the use of a single crystal piezoelectric film bonded onto the wafer to form the SAW sensors that can be protected using the antenna.

Information provided herein referring to or concerning cut angles and crystal orientation can be ascertained in the IEEE Std-176 standard on piezoelectricity (ANSI/IEEE Std 176-1987 IEEE Standard on Piezoelectricity, http://standards.ieee.org/reading/ieee/std_public/description/ultrasonics/176-1987_desc.html). The material constants used for all the computations are those of Kovacs, et al. for lithium tantalate and niobate (G. Kovacs, M. Anhorn, H. E. Engan, G. Visintini, C. C. W. Ruppel, "Improved material constants for LiNbO$_3$ and LiTaO$_3$", Proc. of the IEEE Ultrasonics Symposium, 435-438, 1990). Data for Silicon (mass density and elastic/thermoelastic constants) can be found in Landolt-Bornstein, as well as for fused quartz (silica) and aluminum (Landolt-Bornstein, Numerical data and functional relationships in science and technology, Group III, Crystal and solid state physics, Vol. 11, K. H. Hellwege, and A. M. Hellwege, Eds., Springer-Verlag Berlin-Heidelberg-New York 1979). The sensitivity of the delay to temperature is classically given (cf. for instance Leonhard Reindl et al, Theory and Application of Passive SAW Radio Transponders as Sensors, IEEE Trans. on UFFC, Vol. 45, No. 5, pp. 1281-1292, 1998) by a Taylor expansion of the delay defined as follows:

$$f_0 = f \times (1 + {}^\theta \alpha (T - T_0)) \quad (1)$$

where f the current frequency at temperature T is given by the ration of the wave velocity V divided by the wavelength $\lambda$ and $f_0$ the frequency at reference temperature $T_0 = 25°$ C. Now defining τ the delay of a wave traveling from a transducer to a reflector and back to the transducer as:

$$\tau = L/V = L(\lambda/f) \quad (2)$$

we can express the delay at a given temperature T as follows:

$$\Delta \tau / \tau = \Delta L / L - (\Delta \lambda / \lambda + \Delta f / f) \text{ with } \Delta \tau = \tau - \tau_0 \quad (3)$$

with $L = L_0 \times (1 + \alpha_1^{(1)}(T - T_0))$ and $\lambda = \lambda_0 \times (1 + \alpha_1^{(1)}(T - T_0))$ and $\alpha_1^{(1)}$ the first order thermal expansion coefficient. Assuming that $\Delta L = L = \Delta \lambda / \lambda \approx \alpha_1^{(1)}(T - T_0)$ allows on for demonstrating that:

$$\Delta \tau / \tau = -(\Delta f / f) \quad (4)$$

and, as a consequence, the temperature coefficient of delay (TCD) is the inverse of the temperature coefficient of frequency (TCF). In one embodiment, the use of real-time sensing includes temperature measurement using SAW-tags based on an inter-digitated transducer (IDT) to excite and detect the surface waves, and reflector groups located along the wave propagation path, diffracting and launching waves back toward the transducer. Although the above consideration holds for resonator-based sensors, other design rules than the following rules are necessary for such sensors.

In the case of LiNbO$_3$ cuts used for SAW tag application (which can be (YX/)/128° or (YZ) cuts), the TCF classically lies in the range [−80; −90] ppm-K$^{-1}$. The TCD value can range up to a value of 100 ppm-K$^{-1}$ as the maximum delay variation due to temperature. The inventors recognize this parameter as one method to set the delay range in which a given echo can vary. The above mentioned TCD can be used to set the minimum delay between two echoes to avoid any signal superposition (collision) and prevent clear and efficient differentiation during the measurement process.

According to various embodiments, an apparatus for real-time sensing of properties during a manufacturing process are described. As described above, the sensing system includes a sensor configured to be mounted within a processing chamber, the processing chamber having a structure that at least partially surrounds and encloses a processing environment, wherein the sensor is assigned to a specific region of the processing chamber to monitor a physical or chemical property of the assigned region of the chamber, and a reader system having componentry configured to wirelessly interrogate the sensor using a high frequency interrogation sequence that includes (1) transmitting a request pulse signal to the sensor, the request pulse signal being associated with a designated frequency band, and (2) receiving a uniquely identifiable sensor response signal from the sensor that provides real-time monitoring of variations in the physical or chemical property at the assigned region of the chamber.

Figure 3A:
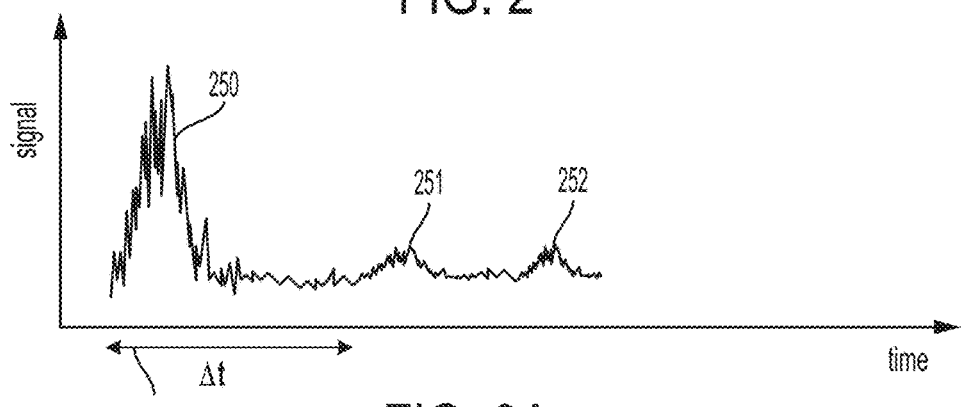
FIG. 3A illustrates a response signal during sensor interrogation.

However, as illustrated in FIG. 3A, the structure of the processing chamber produces an interference response signal 250 that is received by the reader system immediately following the transmission of the request pulse signal. To effectively interrogate the sensors mounted within the processing chamber, the sensor is designed to delay the sensor response signal for a delay time 260 that exceeds the time duration of the interference response signal 250 from the structure, such that echo signals 251, 252 from one or more sensors can be received with less interference from the structure. The delay time 260 should greater than or equal to 0.5 msec (millisecond), or preferably greater than or equal to 1 msec. For example, the delay time should range from 1 to 1.5 msec.

Figure 3B:
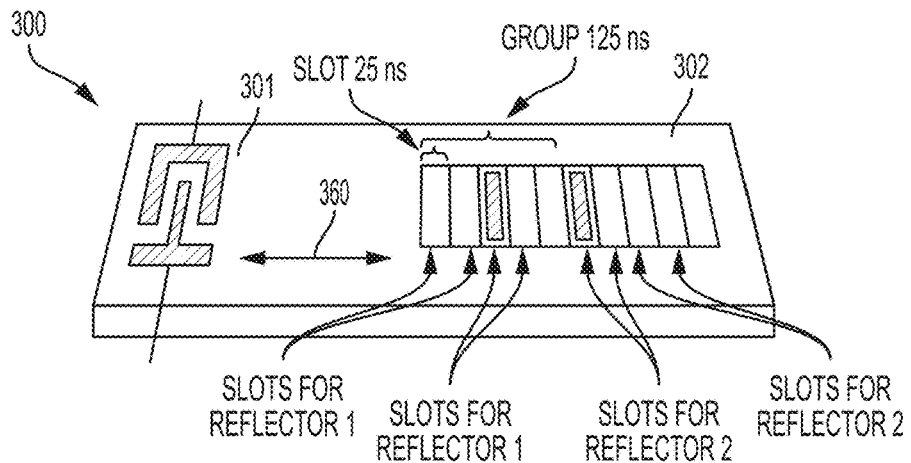
FIG. 3B depicts a representative view of a surface acoustic wave (SAW) sensor according to an embodiment.

FIG. 3B provides a simplified schematic of a SAW-tag sensor 300 with inter-digitated transducer (IDT) 301, with slots provided as reflectors 302 positioned in groups for a given delay range. Assuming two delays, $T_1$ and $T_2$, close to one another, a fundamental design rule can include a sensor designed to avoid the overlap of the two corresponding echoes. In that purpose, an important parameter to take into account is the echo spreading. This parameter is related to the transducer length and the delay line operation. Actually, one must consider that the form of the echo on the impulse response of the SAW-tag results from the self-convolution of the impulse response of the transducer prolongated by the number of electrodes in a given reflector. As also shown in FIG. 3B, the sensor 300 can be designed to space the reflectors 302 at a distance 360 from the transducer 301 that delays the response to the interrogation signal by a sufficient amount to mitigate structure interference. Determination of the phase speed from the dispersion relation for the surface acoustic wave, together with the desired delay time 260, can provide guidance for the distance 360 in the design of sensor 300.

In the case of SAW-tags designed and fabricated on LiNbO$_3$ (YX/)/128°, considering an aperture of 70 μm, the number of electrode pairs in the transducer can be limited to 15 to achieve an electrical impedance close to 50 Ohms on the whole operation spectrum (we consider here the 2.45 GHz-centered ISM band regulation for generality reason). This design consideration equates to a spectrum range set to 85 MHz, yielding a minimum length of 30 oscillations to avoid the spectrum overcoming the above mentioned value. The duration of such an excitation burst can be about 12 ns (whereas only about 6 ns would be mandatory using a 15-finger-pair IDT to couple the energy at maximum, i.e., the transducer and excitation spectrum overlaps at best), which makes the length of the self-convolution equal to 24 ns, majored to 25 ns in FIG. 3 for convenience.

Referring again the two above-mentioned echoes, the minimum duration between the echoes can be set to avoid any overlap of their signature on the whole temperature range. A 100° C. temperature variation can result in a $10^{-2}$ relative change in the nominal value of the delay. Therefore, when two sensors are submitted to a temperature difference of 200° C., the delay between the two echoes is expected to be at minimum 2% of the nominal longest delay (for instance, $T_2$, if we assume $T_1<T_2$) plus 25 ns, the maximum time spreading of one echo. As an example, a 30 ns echo separation can be selected because the spreading of one echo does not overcome 20 ns. For illustration purpose, if a 500 ns delay is considered for $T_2$, the above rule infers that $T_1$ correspond to a maximum delay of 465 ns (i.e., 500-10-25 ns). This exercise provides a general design rule which allows a design to comply with ISM regulations, and address the separation of two echoes when measuring several sensors at once.

Therefore, as an example, if fifteen (15) sensors are to be interrogated simultaneously, once the initial delay $T_0$ of the first sensor (the one which "answers" first) is fixed, all of the first echoes of the sensors will arise in a minimum of $T_0$ plus 35 ns times 15 delay range (e.g., $T_0$+525 ns), guaranteeing that the sensor set can be interrogated and the response read without collision on the whole temperature range. After a minimum guard delay following the last sensor's first echo (the first echo of the sensor "answering" last), the same analysis can be applied for the second echo of the sensors. This guard delay, of course, can overcome the delay between the two "first" echoes, the above-mentioned 35 ns, otherwise it is difficult to differentiate the pulse train of the first echo and the pulse train of the second echo. This delay could be typically 50 ns, but for more signal process robustness a delay ranging between 100 and 200 ns can be used. As another example, a delay of 150 ns can be used to provide a difference of delay sufficiently long to avoid confusion between the first and second pulse trains, and yield a wave path sufficiently short to minimize losses due to wave propagation ($10^{-2}$ dB/λ can be typical as a loss parameter on (YX/)/128° LiNbO$_3$ surface which is validated when comparing theoretical and experimental SAW-tag responses).

Figure 4A:
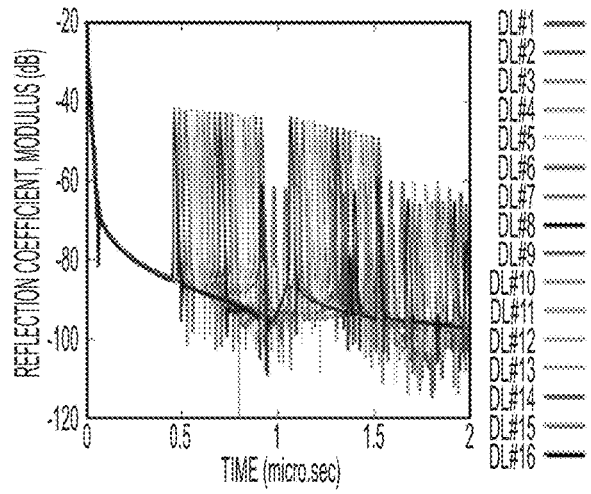
FIGS. 4A through 4D exemplify response signals following interrogation of plural sensors according to an embodiment.
Figure 4B:
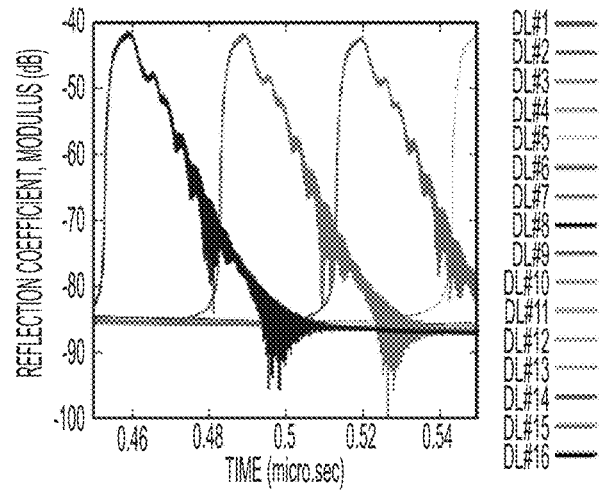
Figure 4C:
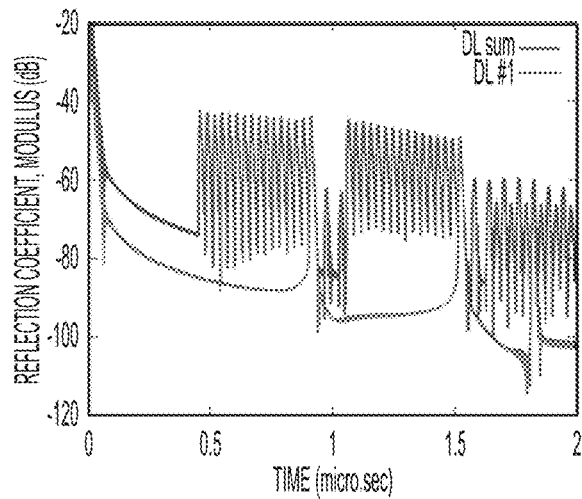

According to an example, in consideration of the design rules outlined above for a SAW device, a wafer-type sensor can include four (4) groupings of sixteen (16) sensors assigned to a separate frequency band. FIGS. 4A through 4D show the typical responses of a grouping of sixteen (16) sensors superimposed to elucidate the sequence of peaks, including the first and second echoes (see FIG. 4A), and the separation between the peaks (see the close-up of the first three echoes in FIG. 4B). In FIG. 4C, the result of summing all the delay line $S_{11}$ parameters is plotted, and the corresponding time response is computed. For the sake of comparison, one of the delay line time-domain responses is superimposed to illustrate the actual effect of the summation: e.g., the baseline is increased, meaning that the signal-to-noise ratio is decreased, yet not sufficiently degraded to prevent the system operation (as illustrated in FIG. 4C).

Figure 4D:
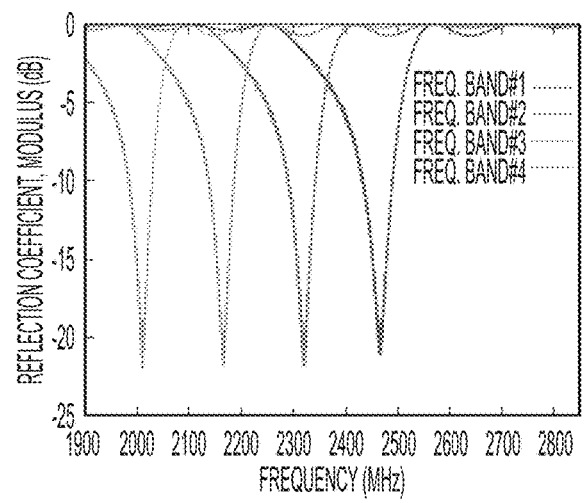

The interrogation of sixty five (65) sensors on a single wafer can be achieved by fabricating four sets of sixteen (16) sensors operating in different frequency bands (plus one in one of the four frequency bands). Using IDTs composed of 15 finger-pairs, the spectrum spreading of the SAW-tag is about 150 MHz (i.e., plus or minus 75 MHz from the central frequency). Therefore, according to one embodiment, the second, third, and fourth frequency bands can be shifted 150, 300 and 450 MHz, respectively, from the first frequency band to generate the three other frequency bands to complete the whole wafer-type sensor design. The resulting spectral distribution is shown in FIG. 4D, allowing for a clear separation of each frequency band. As a consequence, the same (time-domain) echo distribution is preserved for each band, which simplifies the signal processing, since only the frequency band has to be shifted (i.e., the local oscillator of the interrogator), as well as the reception filter which must correspond to the current treated band.

Consequently, the interrogation process for addressing sixty five (65) measurement points onto the wafer can include setting the central frequency to the central frequency of the first band (i.e., set the local oscillator and the reception filter to the current frequency band), to set the reader in emission mode and to launch the RF interrogation signal to the reader antenna, to switch the reader to the reception mode after the emission of the whole interrogation signal (e.g., 15 ns max for a 15-finger-pair IDT, corresponding to 15 signal periods plus some delay to fade the antenna contribution properly), and to collect the signals re-emitted by the sensors (e.g., max delay about 2 µs), to repeat the operation as much as the signal must be averaged to improve the SNR, and then to set the next frequency band and repeat the operation as long as the four bands have not been scanned.

Figure 5:
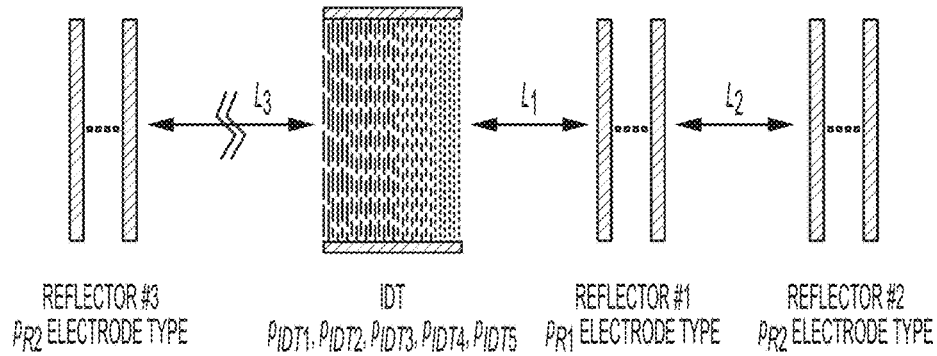
FIG. 5 depicts a representative view of a SAW-tag sensor according to another embodiment.

Note that the first computations were made considering a two-echo solution. However, the same design process can be applied to a three pulse sensor that will allow meeting desired accuracy targets. In that perspective, an effort can be achieved to optimize the sensor response according the measurements achieved, and more particularly, optimizing the transducer performance. Several approaches can be taken, including varying the period in the IDT to cover the whole 2.4-2.5 GHz band, and to slightly shift the reflectors so that they do not actually exhibit the same reflection spectral coverage. For instance, the IDT can be split into five (5) sections (see FIG. 5; or more or less than five (5)) for which the mechanical period is set respectively to $p_{IDT1}$=0.78 nm ($\lambda$=1.56 µm), $p_{IDT2}$=785 nm ($\lambda$=1.57 µm), $p_{IDT3}$=790 nm ($\lambda$=1.58 µm), $p_{IDT4}$=795 nm ($\lambda$=1.59 µm), and $p_{IDT5}$=800 nm ($\lambda$=1.6 µm), considering a metal thickness of 100 nm (relative electrode height h/$\lambda$ in excess of 6%) and a metal ratio of 0.45. The IDT the consists of a first electrode pair at $p_{IDT1}$, two electrode pairs set at $p_{IDT2}$, five electrode pairs at $p_{IDT3}$, four electrode pairs at $p_{IDT4}$ and three at $p_{IDT2}$.

Along this distribution, the impedance of the transducer remains close to approximately 50$\Omega$, a design condition for optimizing the energy transmission from the antenna to the SAW device and vice versa. Several other configurations can be imagined; however, the leading idea is to spread the IDT optimal response on a band larger than the one obtained considering a purely synchronous IDT structure at $\lambda$=1.57 µm (see FIGS. 6A and 6B). On the other hand, three groups of reflectors can be used according to the above remark (improving the sensor resolution and removing phase uncertainties), two groups on one side of the reflector and one group on the other side of the reflector to optimize the sensor response. The mechanical period of each group can, respectively, be set to $p_{R1}$=780 nm and $p_{R2}$=790 nm with a metal ratio set to 0.55. A scheme is reported to illustrate the SAW-tag concept.

The choice of a metal ratio of 0.45, for example, in the IDT can be selected to reduce or minimize reflection phenomena (reflection coefficient smaller than 3% on a single obstacle) inside the transducer, whereas the reflector metal ratio can be set to 0.55, yielding a reflection coefficient on a single obstacle close to 5%. The metal ratio can range from 0.4 to 0.6, for example (the minimal width of the electrode can be equal to 351 nm for a metal ratio of 0.45 and a period $p_1$=0.78). Using this electrode distribution, a balanced distribution of the SAW-tag response can be achieved with all the three pulses (echoes) of the delay lines close to −20 dB. In this assessment, the propagation loss can be about $10^{-3}$ dB/A for the selected 100 MHz band (from 2.4 to 2.5 GHz).

According to an additional embodiment, another configuration can include a single phase uni-directional transducer (SPUDT) according to designs published in Plessky, et al. (S. Lehtonen, V. P. Plessky, C. S. Hartmann, and M. M. Salomaa, "SPUDT filters for the 2.45 GHz ISM band", IEEE Trans. Ultrason. Ferroelectr. Freq. Control 51, pp. 1697-1703, 2004). Therein, the reflectors are located on one side of the IDT which emits more energy in that direction than on the opposite one.

According to yet additional embodiments, the coupling and reflectivity of SAW-tag sensors based on Rayleigh waves on)(YX//128° LiNbO$_3$ substrates can be adjusted by depositing a layer, such as a SiO$_2$ layer. An increase in the coupling can reduce the insertion loss and increase the interrogation distance. In the same field of consideration, the use of pure shear waves for SAW-tags is also contemplated, wherein shear waves can be guided by the deposition of a guiding film onto the SAW device.

According to various embodiments, numerous configurations are contemplated for forming piezoelectric films, such as lithium niobate, lithium tantalite, or langasite, on the workpiece, including silicon workpieces. Piezoelectric films can be formed by wafer molecular bonding and lapping/polishing. Therein, piezoelectric films are bonded and thinned, or transferred onto silicon, allowing for the excitation of guided modes (true surface waves) without radiation losses in the substrate underneath the film (the wave is guided by the silicon substrate) exhibiting an electromechanical coupling $k_s^2$ (for which $1-(f_r/f_a)^2$ with $f_r$ and $f_a$ the resonance and anti-resonance frequencies of the mode signature respectively provides a reliable estimation, provided the mode is not mixing energy with other guided modes nor waves radiated from the surface) in excess of 3% and a reflection coefficient on a single obstacle at minimum equal to 3%. Several examples can be provided to determine the actual configurations for shear waves on LiTaO$_3$ (YX/)/32° to (YX/)/48° and on several other singly rotated lithium tantalate cuts onto silicon (or sapphire or any substrate allowing wave guiding), and Rayleigh waves on LiNbO$_3$ (YX/)/128° and shear waves on almost all the singly rotated lithium niobate cuts onto silicon are contemplated.

More generally, for a material film, such as LiNbO$_3$, transferred onto silicon, shear waves can be used for all the propagation directions, excluding propagation directions ranging from 100° to 140°, whereas Rayleigh waves can be used in the propagation direction range from 100° to 180°. The preferred solutions for shear waves correspond to propagation directions ranging from 0° to 20° and from 140° to 180° to promote a large absolute value of TCF (yielding a TCD value in excess of 60 ppm-K$^{-1}$). Note that for fundamental symmetry reasons, the properties of the waves are the same when adding 180° to the angle $\theta$ (rotation around X crystallographic axis, referring the IEEE Std-176 standard) of a given singly-rotated cut. To maximize the SAW-tag operation, one can select a propagation direction from −20° to +20° because the electromechanical coupling is maximum (in excess of 20%). It is noted, however, that these design considerations allow for second order improvements, since most of the crystal cuts can be used for the considered application, as mentioned above.

More generally, for a material film, such as LiTaO$_3$, transferred onto silicon, the shear wave mode is exploitable for a propagation direction ranging from −30° to +90°. Moreover, the TCF is particularly favorable for a temperature sensor in the angular range of −30° to 0° for which the coupling factor is ranging from 3 to 8%. According to a preferred embodiment, when considering the coupling factor, the cut can be near the (YX/)/36° for which the TCF is close to zero. This orientation family can be considered for the measurement of a broad range of properties, yet is less optimal for temperature.

Figure 9:
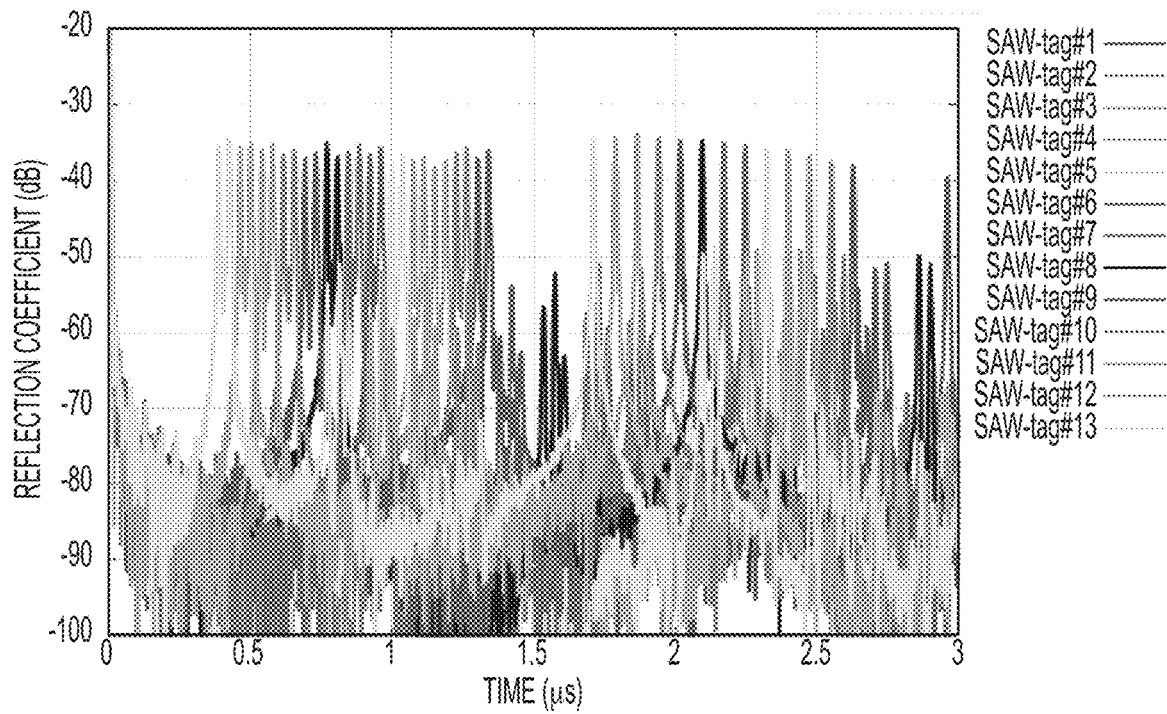
FIG. 9 exemplifies response signals following interrogation of plural sensors according to an embodiment.

FIG. 7 shows an example of a SAW-tag operating near 2.45 GHz, manufactured of a material film, such as $LiNbO_3$, transferred onto silicon. Device 700 includes interdigitated transducer 701, antenna 702, and reflector groups 703. FIG. 8 shows exemplary reflection coefficient |S11| in time domain for eight (8) SAW-tag sensors operating at room temperature (approximately 20 degrees C.) in the 2.4 to 2.5 GHz frequency band. FIG. 9 shows exemplary reflection coefficient |S11| in time domain for thirteen (13) SAW-tag sensors operating at 60 degrees C. in the 2.4 to 2.5 GHz frequency band.

Figure 10:
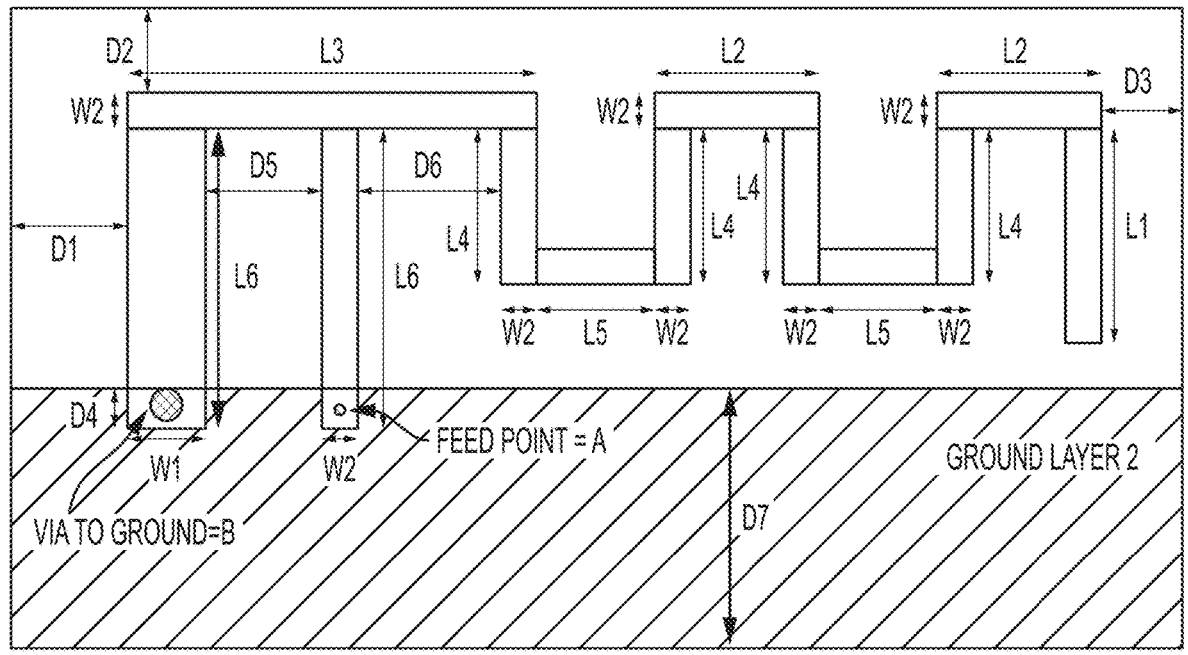
FIG. 10 depicts an antenna according to an embodiment.

According to various embodiments, the antenna design for the sensors can include single pole designs, dipole designs, helical designs, circular designs, spiral designs, patch designs, or meander designs, or any combination of two or more thereof. FIG. 10 illustrates a meander-type antenna, illustrating several dimensions to be selected for the antenna design. Metallization of the antenna can produce an antenna thickness ranging up to 50 micron, or up to 35 micron (e.g., ranging from 10 to 35 micron in thickness). The antenna may be composed of Al, Cu, Ni, Au, or alloys thereof. The antenna can be fabricated using a variety of deposition techniques, including electroplating.

In several embodiments, the wafer-type sensor can be operated during exposition to plasma. The upper, exposed surface of the device can be exposed to plasma, including plasma chemistry and ion bombardment. As a result, if unprotected, the device can be etched. Therefore, protection of the SAW-tag and the antenna, while operating the sensor under plasma conditions for more than several of minutes (e.g., up to 5-10 minutes) is contemplated according to several embodiments. The wafer-type sensor thickness can range up to 5 mm (millimeters), preferably up to 2 mm, more preferably up to 1.5 mm, and most preferably up to 1.2 mm. In some embodiments, the sensors include a protective cover, such as an etched glass cover, and in other embodiments, the sensors are embedded in the substrate, such as a silicon substrate.

Figure 11:
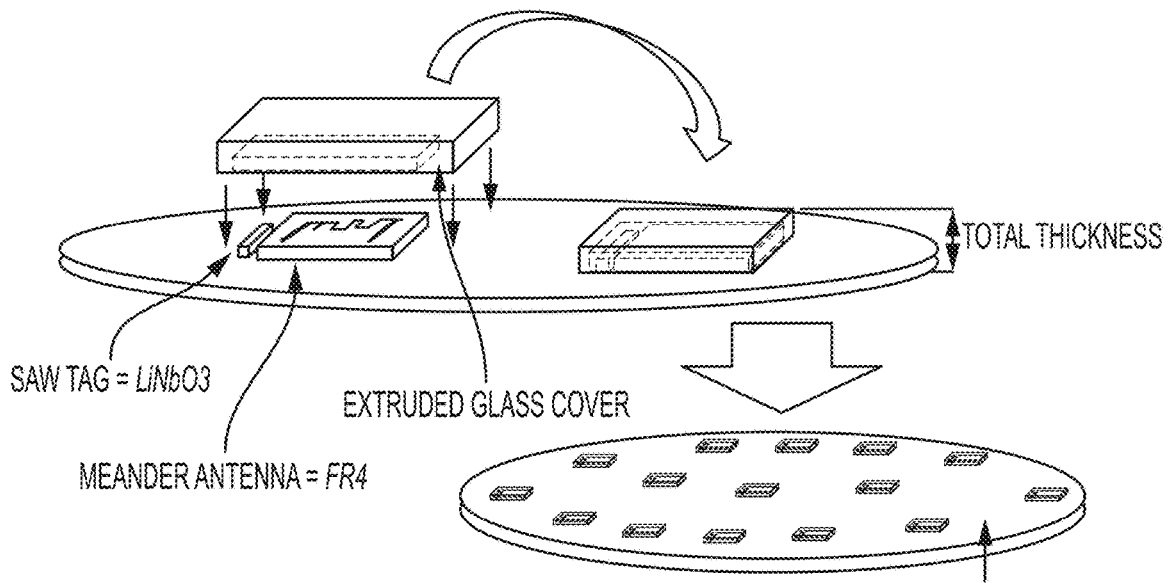
FIG. 11 depicts a method of fabricating a sensor on a substrate according to an embodiment.

According to one embodiment shown in FIG. 11, a SAW-tag and its antenna are manufactured separately, and then bonded onto a silicon substrate. The device is connected using wire bonding, and protected by a protective layer, such as a machined glass cover. Since the protective cover is an electrical insulator, the connection wire may be in contact with the cover. It is then bonded onto the silicon substrate to form a hermetically sealed cavity. This operation should be operated under vacuum, or at least under a dry air condition, to reduce or avoid any oxygen trapped in the cavity.

Figure 12:
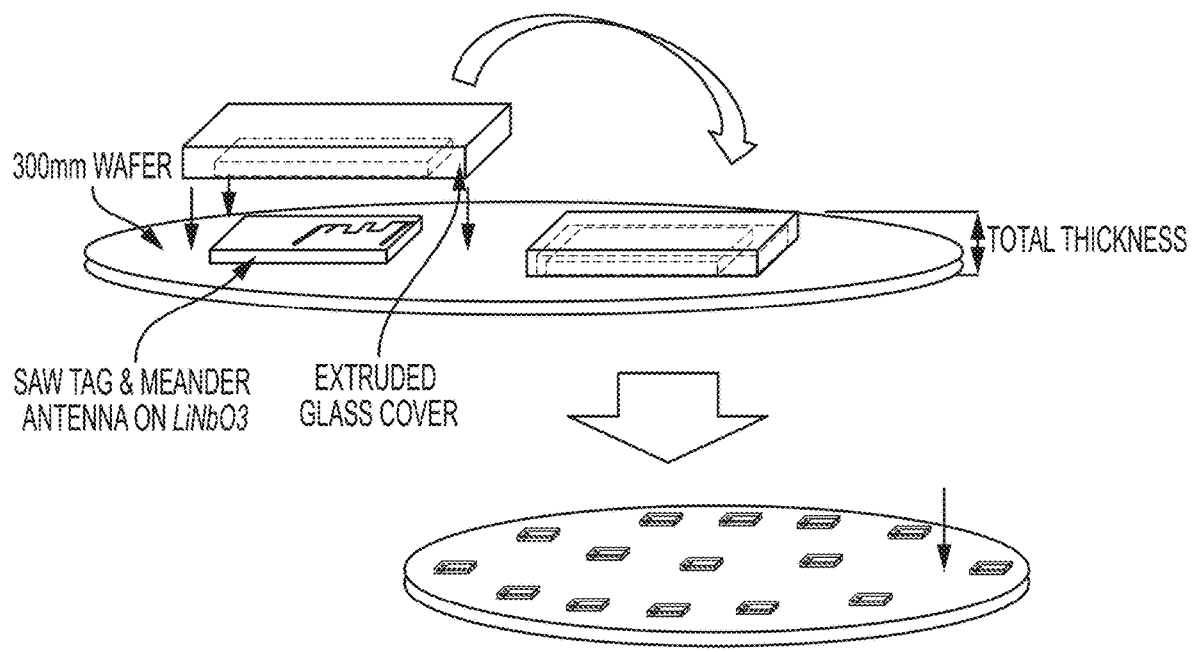
FIG. 12 depicts a method of fabricating a sensor on a substrate according to another embodiment.

According to another embodiment shown in FIG. 12, a SAW-tag and its antenna are manufactured on the same substrate, and then bonded onto a silicon substrate. The device is protected a protective layer, such as a machined glass cover.

Figure 13:
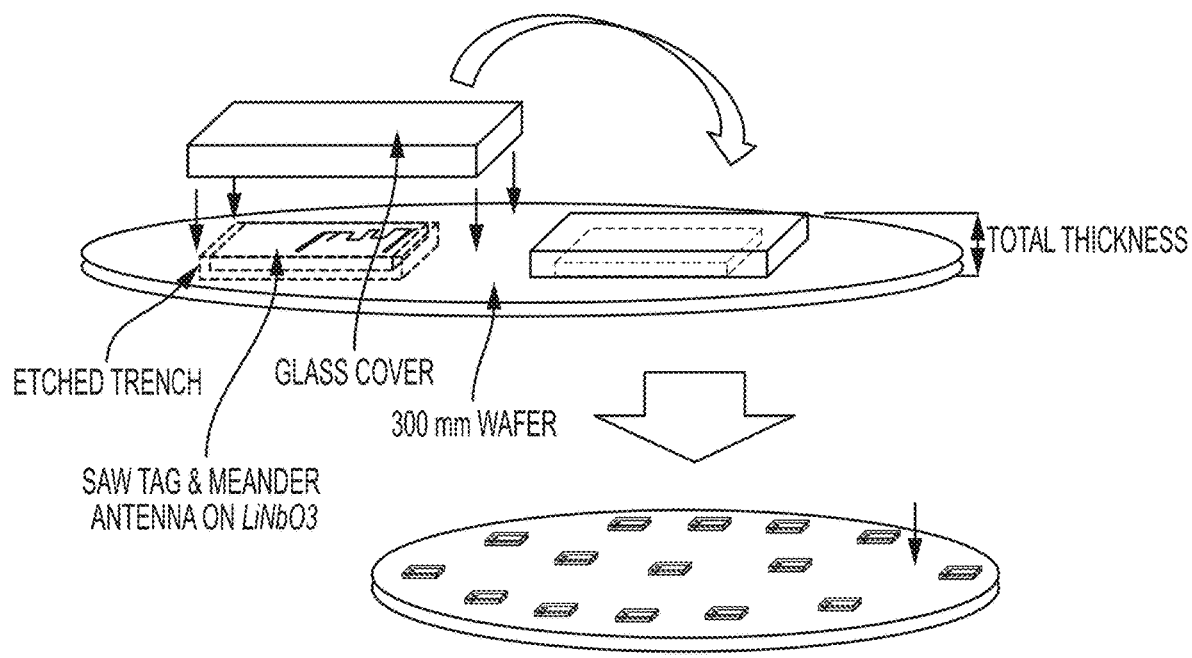
FIG. 13 depicts a method of fabricating a sensor on a substrate according to another embodiment.

According to another embodiment shown in FIG. 13, a SAW-tag and its antenna are fabricated in a manner similar to the device depicted in FIGS. 11 and 12. However, in this embodiment, the silicon substrate is etched to allow locating and recessing the SAW-tag and antenna device within the silicon substrate, i.e., at least partially or fully recessed beneath an upper surface of the silicon substrate. As a result, the protective layer can include a planar cover, such as a glass plate or sheet.

Figure 14:
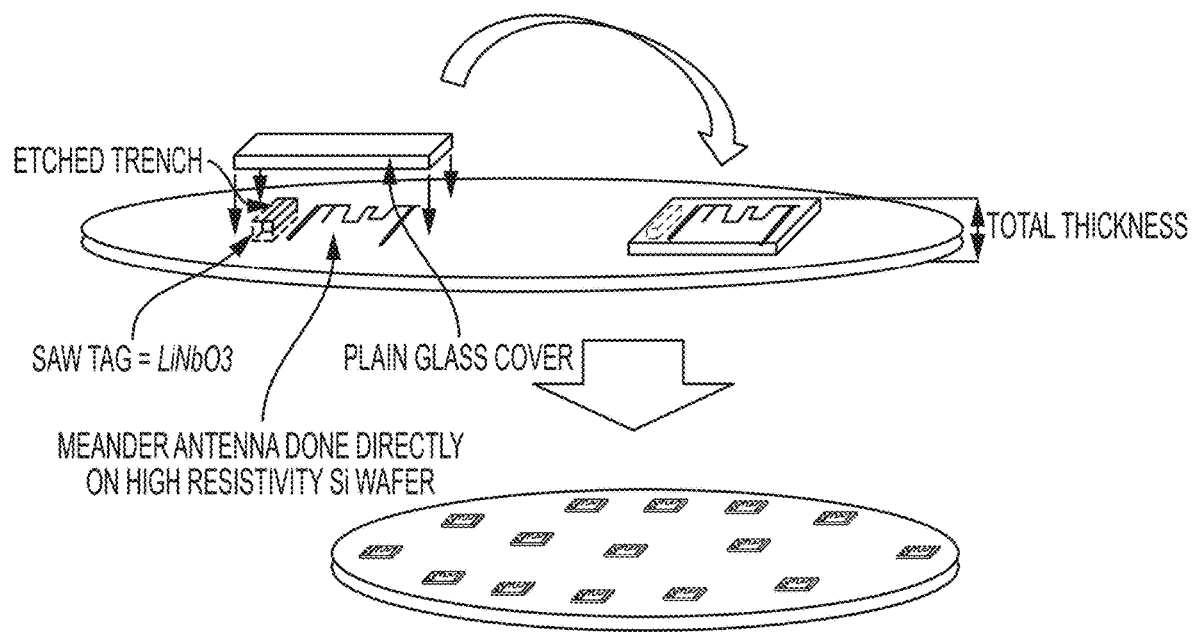
FIG. 14 depicts a method of fabricating a sensor on a substrate according to another embodiment.

According to another embodiment shown in FIG. 14, a SAW-tag and its antenna are fabricated directly on a silicon substrate. Fabrication of the device directly on the silicon substrate can include etching and deposition techniques, with appropriate patterning to remove and add material to the silicon substrate. Each device is independently covered with a protective layer, using for example an adapted silica mark.

Figure 15:
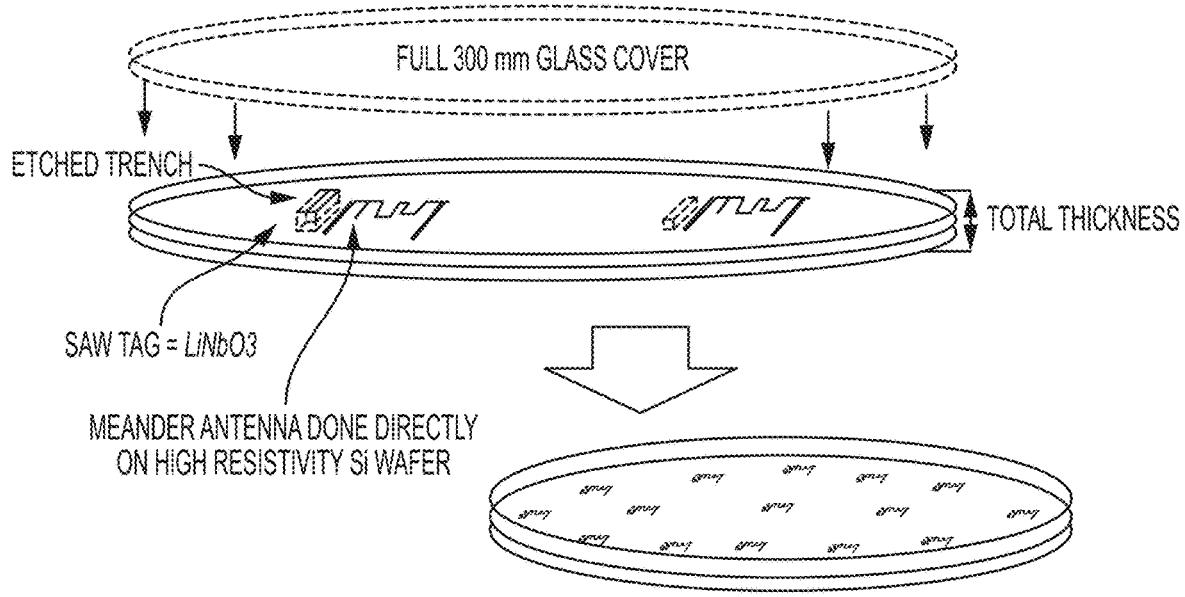
FIG. 15 depicts a method of fabricating a sensor on a substrate according to another embodiment.

According to another embodiment shown in FIG. 15, a SAW-tag and its antenna are fabricated directly on a silicon substrate. However, each device is covered with a full-substrate protective layer, such as a glass cover plate.

Figure 16:
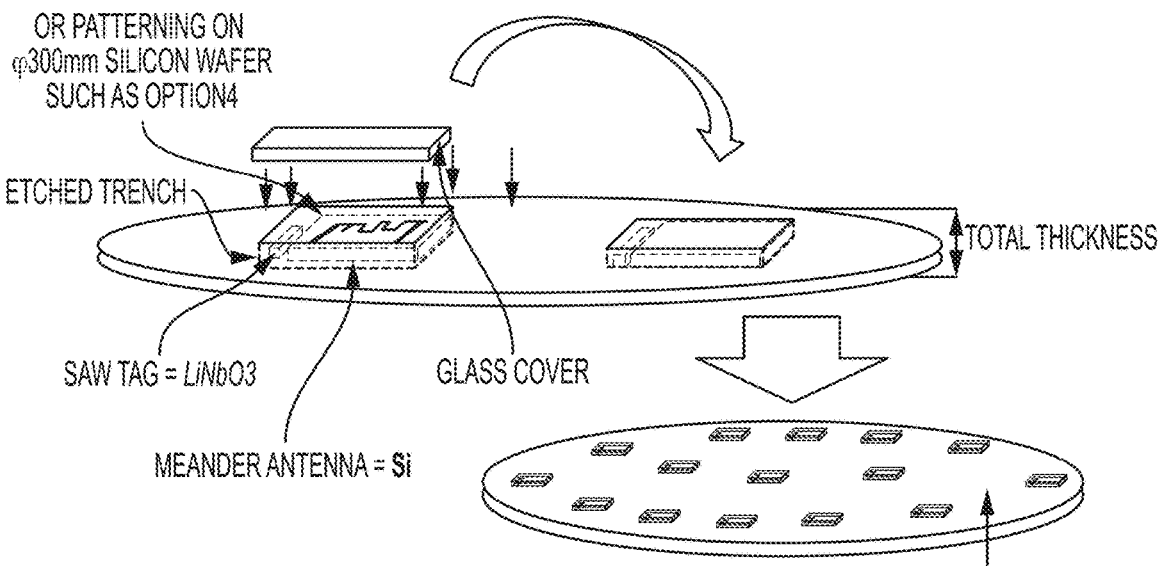
FIG. 16 depicts a method of fabricating a sensor on a substrate according to yet another embodiment.

According to yet another embodiment shown in FIG. 16, a SAW-tag and its antenna are fabricated silicon, the SAW-tag being manufactured on $LiNbO_3$ or $LiTaO_3$, for example, and then assembled and bonded onto the silicon substrate. The SAW-tag sensor and its antenna can be protected by a machined (etched) Silica plate.

In other embodiments, plural sensors can be fabricated on a $LiNbO_3$ or $LiTaO_3$ substrate, and then bonded to or embedded within a silicon substrate. The technique of flip-chip can also be exploited to build the device(s) mounted onto a silicon substrate. The antenna can be directly fabricated onto the silicon substrate, followed by flip-chipping the SAW-tag proximate the antenna to reduce undesired parasitic capacitance or self-inductance due to wire bonding. The use of a flip chip approach can be compatible with the application as the back of the SAW-tag will be exposed to the processing environment, such as plasma, but not the front side.

While the device, including sensor and/or antenna, can be fabricated on a semiconductor substrate, such as a silicon substrate, other materials and substrates are contemplated. The substrate may be an insulator, a conductor, or a semiconductor. The substrate may include any material portion or structure of a device, particularly a semiconductor or other electronics device, and may, for example, be a base substrate structure, such as a semiconductor substrate or a layer on or overlying a base substrate structure such as a thin film. The substrate may be a conventional silicon substrate or other bulk substrate comprising a layer of semi-conductive material. As used herein, the term "bulk w substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped. Thus, substrate is not intended to be limited to any particular base structure, underlying layer or overlying layer, patterned or un-patterned, but rather, is contemplated to include any such layer or base structure, and any combination of layers and/or base structures.

As the sensor can be required to operate during plasma operation, these embodiments can account for radio frequency (RF) electromagnetic fields used to generate plasma in a vacuum environment. RF operation can range from the low MHz frequencies (e.g., 1 MHz) to very high frequency (VHF) operation (e.g., 100 MHz). As a result of the non-linear behavior of plasma, harmonics of the excitation frequency are produced, which can impact the operation of a SAW-tag sensor at frequencies near the 434-MHz centered and 2.45-GHz centered ISM bands. To accommodate, signal filtering can be employed to eliminate harmonic contribution to the detected signal. As an example, when the RF excitation frequency is about 13.56 MHz, the harmonic content as a result of plasma is relatively inconsequential within the 2.45 GHz region (and more generally above 2 GHz). However, at higher RF excitation frequencies, harmonic content may be more important, and impact sensor operation. Even with favorable conditions corresponding to an operation above 2 GHz, RF filtering can be used to reject all unwanted contributions due to the plasma source, and the inventors have observed successful monitoring of SAW devices with active plasma conditions, particularly when the plasma power overcomes 70 Watts (W). For example, RF filtering can be employed for plasma power conditions exceeding 50 W.

As noted previously, the above describes an apparatus for real-time sensing of properties in electronic device manufacturing, according to several embodiments. The electronic device manufacturing system can include semiconductor device equipment capable of processing a substrate, such as a 200 mm or 300 mm substrate, in a gas-phase environment, that may or may not include plasma. In semiconductor manufacturing, plasma can be used to assist the deposition of material onto a substrate, or the etching of material from the substrate. Examples of plasma processing systems, for either deposition, or etching, or both deposition and etching are described below and depicted in FIGS. 17A through 17D.

Figure 17A:
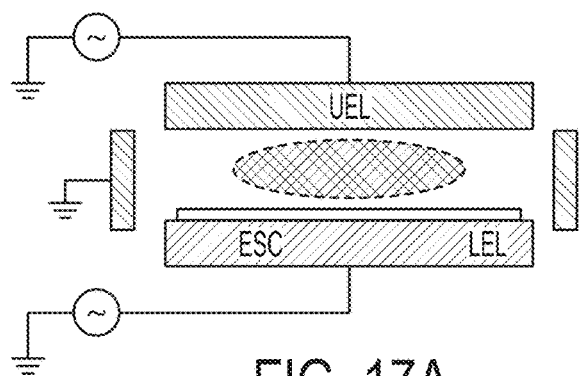
FIGS. 17A through 17D provide schematic illustrations of plasma processing systems for performing the method of etching according to various embodiments.

FIGS. 17A through 17D provide several plasma processing systems that may be used to facilitate plasma-excitation of a process gas. FIG. 17A illustrates a capacitively coupled plasma (CCP) system, wherein plasma is formed proximate a substrate between an upper plate electrode (UEL) and a lower plate electrode (LEL), the lower electrode also serving as an electrostatic chuck (ESC) to support and retain the substrate. Plasma is formed by coupling radio frequency (RF) power to at least one of the electrodes. As shown in FIG. 17A, RF power is coupled to both the upper and lower electrodes, and the power coupling may include differing RF frequencies. Alternatively, multiple RF power sources may be coupled to the same electrode. Moreover, direct current (DC) power may be coupled to the upper electrode.

Figure 17B:
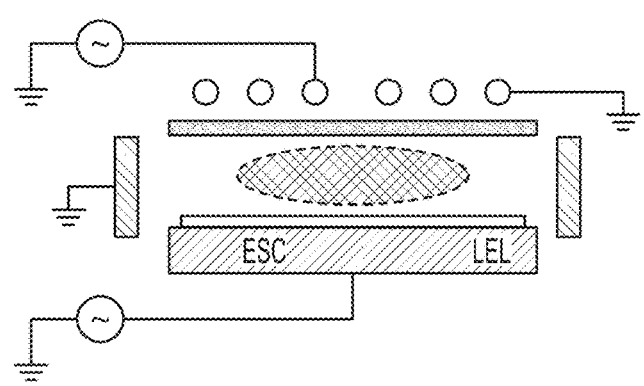

FIG. 17B illustrates an inductively coupled plasma (ICP) system, wherein plasma is formed proximate a substrate between an inductive element (e.g., a planar, or solenoidal/helical coil) and a lower plate electrode (LEL), the lower electrode also serving as an electrostatic chuck (ESC) to support and retain the substrate. Plasma is formed by coupling radio frequency (RF) power to the inductive coupling element. As shown in FIG. 17B, RF power is coupled to both the inductive element and lower electrode, and the power coupling may include differing RF frequencies.

Figure 17C:
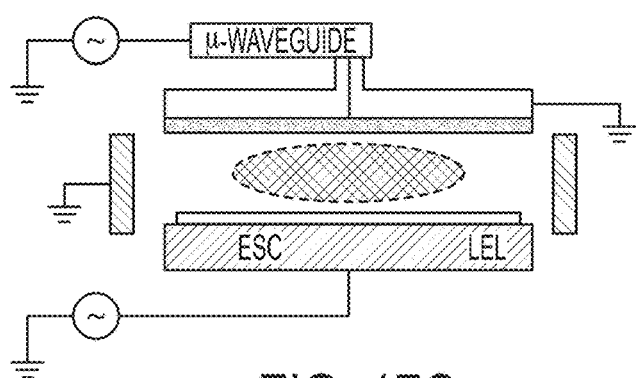

FIG. 17C illustrates a surface wave plasma (SWP) system, wherein plasma is formed proximate a substrate between a slotted plane antenna and a lower plate electrode (LEL), the lower electrode also serving as an electrostatic chuck (ESC) to support and retain the substrate. Plasma is formed by coupling radio frequency (RF) power at microwave frequencies through a waveguide and coaxial line to the slotted plane antenna. As shown in FIG. 17C, RF power is coupled to both the slotted plane antenna and lower electrode, and the power coupling may include differing RF frequencies.

Figure 17D:
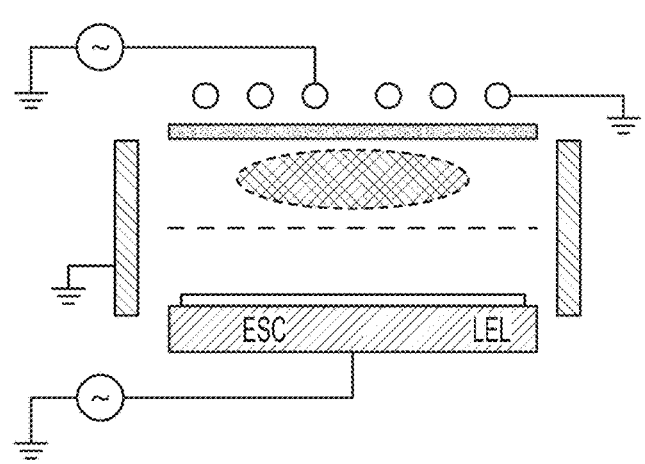

FIG. 17D illustrates remote plasma system, wherein plasma is formed in a region remote from a substrate and separated from the substrate by a filter arranged to impede the transport of charged particles from the remote plasma source to a processing region proximate the substrate. The substrate is supported by a lower plate electrode (LEL) that also serves as an electrostatic chuck (ESC) to retain the substrate. Plasma is formed by coupling radio frequency (RF) power to a plasma generating device adjacent the remotely located region. As shown in FIG. 9D, RF power is coupled to both the plasma generating device adjacent the remote region and lower electrode, and the power coupling may include differing RF frequencies.

While not shown, the plasma processing systems of FIGS. 17A through 17D can include other componentry, including coated and replaceable parts design to protect interior surfaces of the processing chamber. Such parts can include deposition shields, baffle plate assemblies, confinement shields, etc., that surround the processing environment and potentially interfere with signal exchange between the interrogator and the instrumented substrate.

The plasma processing systems of FIGS. 17A through 17D are intended to be illustrative of various techniques for implementing the stepped ion/radical process described. Other embodiments are contemplated including both combinations and variations of the systems described.

In the claims below, any of the dependents limitations can depend from any of the independent claims.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Workpiece", "Substrate", or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. An apparatus for real-time sensing of properties during a manufacturing process in a manufacturing system, comprising:
   a sensor configured to be mounted within a processing chamber of the manufacturing system, the processing chamber having a structure that at least partially surrounds and encloses a processing environment, wherein the sensor is assigned to a specific region of the processing chamber to monitor a physical or chemical property of the assigned region of the chamber; and
   a reader system having componentry configured to wirelessly interrogate the sensor using a high frequency interrogation sequence that includes (1) transmitting a request pulse signal to the sensor, the request pulse signal being associated with a frequency band, and (2) receiving a uniquely identifiable sensor response signal from the sensor that provides real-time monitoring of variations in the physical or chemical property at the assigned region of the chamber,
   wherein the structure of the processing chamber produces an interference response signal that is received by the reader system immediately following the transmission of the request pulse signal, and
   wherein the sensor is configured to delay the sensor response signal for a delay time that exceeds the time duration of the interference response signal from the structure.

2. The apparatus of claim 1, wherein the manufacturing system includes a semiconductor manufacturing system, or a non-semiconductor manufacturing system.

3. The apparatus of claim 1, wherein the manufacturing system facilitates manufacturing of semiconductor devices, photonic devices, photo-emission devices, photo-absorption devices, or photo-detection devices.

4. The apparatus of claim 1, wherein the manufacturing system facilitates manufacturing of metallic, semi-metallic, non-metallic, polymeric, ceramic, or glass or glass-like workpieces.

5. The apparatus of claim 1, wherein the delay time exceeds 0.5 milliseconds (msec).

6. The apparatus of claim 1, wherein the delay time exceeds 1 msec.

7. The apparatus of claim 1, wherein the delay time ranges from 1 msec to 1.5 msec.

8. The apparatus of claim 1, further comprising:
   a workpiece to be arranged within the processing environment of the manufacturing system, wherein the apparatus comprises a plurality of the sensors mounted on the workpiece.

9. The apparatus of claim 1, wherein:
   the apparatus comprises a plurality of the sensors grouped and assigned to plural, uniquely defined frequency bands, including the frequency band.

10. The apparatus of claim 1, wherein each sensor includes a surface acoustic wave (SAW) delay line device.

11. The apparatus of claim 1, wherein the physical or chemical property includes temperature or differential temperature.

12. The apparatus of claim 1, wherein the sensor includes an inter-digitated transducer to excite and subsequently detect surface waves, and one or more reflector groups to diffract and reflect surface waves back towards the inter-digitated transducer, and wherein the one or more reflector groups are spaced apart a pre-determined distance along a wave propagation path from the inter-digitated transducer such that the sensor is configured to delay the sensor response signal for the delay time.

13. The apparatus of claim 12, wherein the inter-digitated transducer is coupled to at least one antenna for receiving and transmitting signals between the sensor and the reader system.

14. The apparatus of claim 12, wherein one or more reflectors of the one or more reflector groups of the sensor are arranged to produce an impulse response signal in a time domain exhibiting a train of two or more distinct echo impulse responses.

15. The apparatus of claim 12, wherein the one or more reflector groups are located on the same side of the inter-digitated transducer.

16. The apparatus of claim 1, wherein the frequency band has a spectral range of less than 100 MHz.

17. The apparatus of claim 1, wherein the reader system further comprises:
   a radio frequency (RF) filter to reject signals at frequencies outside the frequency band.

18. The apparatus of claim 1, wherein the processing environment includes a gas-phase plasma environment.

19. The apparatus of claim 1, wherein the manufacturing system is an etching system, a deposition system, a plating system, a cleaning system, an ashing system, a thermal treatment system, a lithographic coating system, or a polishing system.

20. The apparatus of claim 1, wherein a signal-to-noise ratio for the sensor response signal, relative to the interference response signal, exceeds 5 dB.

21. An apparatus for real-time sensing of properties during a manufacturing process in a manufacturing system, comprising:
   a sensor configured to be mounted within a processing chamber of the manufacturing system, the processing chamber having a structure that at least partially surrounds and encloses a processing environment, wherein the sensor is assigned to a specific region of the processing chamber to monitor a physical or chemical property of the assigned region of the chamber; and
   a reader system having componentry configured to wirelessly interrogate the sensor using a high frequency interrogation sequence that includes (1) a request pulse signal to the sensor, the request pulse signal being associated with a frequency band, and (2) a sensor response signal that is uniquely identifiable,
   wherein the structure of the processing chamber produces an interference response signal that is received by the reader system immediately after the request pulse signal,
   wherein the sensor and the reader system are configured such that:
      the reader system transmits the request pulse signal to the sensor,
      then the sensor delays the sensor response signal for a delay time that exceeds the time duration of the interference response signal, and
      then the reader system receives the sensor response signal from the sensor.

* * * * *